(12) United States Patent
Liaw

(10) Patent No.: US 8,399,935 B2
(45) Date of Patent: Mar. 19, 2013

(54) EMBEDDED SRAM MEMORY FOR LOW POWER APPLICATIONS

(75) Inventor: Jhon-Jhy Liaw, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 298 days.

(21) Appl. No.: 12/829,084

(22) Filed: Jul. 1, 2010

(65) Prior Publication Data

US 2011/0068413 A1 Mar. 24, 2011

Related U.S. Application Data

(60) Provisional application No. 61/243,896, filed on Sep. 18, 2009.

(51) Int. Cl.
*H01L 29/76* (2006.01)

(52) U.S. Cl. ........ 257/393; 257/336; 257/344; 257/903; 257/E21.437; 257/E21.661; 257/E27.098

(58) Field of Classification Search ................. 257/336, 257/344, 393, 903, E21.437, E21.661, E27.098
See application file for complete search history.

(56) References Cited

U.S. PATENT DOCUMENTS

| | | | | |
|---|---|---|---|---|
| 6,081,465 A * | 6/2000 | Wang et al. | ................ | 365/201 |
| 6,713,334 B2 * | 3/2004 | Nandakumar et al. | ........ | 438/199 |
| 6,794,254 B1 * | 9/2004 | Tzeng et al. | ................ | 438/283 |
| 7,684,264 B2 * | 3/2010 | Hunter et al. | ............ | 365/189.2 |
| 8,000,126 B2 * | 8/2011 | Morikawa et al. | ............ | 365/148 |
| 2006/0275962 A1 | 12/2006 | Lee | | |
| 2008/0181034 A1 | 7/2008 | Hunter et al. | | |

OTHER PUBLICATIONS

Chang, L. et al., "Stable SRAM Cell Design for the 32 nm Node and Beyond," 2005 Symposium on VLSI Technology Digest of Technical Papers, pp. 128-129.

* cited by examiner

*Primary Examiner* — Andy Huynh
(74) *Attorney, Agent, or Firm* — Slater & Matsil, L.L.P.

(57) ABSTRACT

Circuits and methods for providing a dual gate oxide (DGO) embedded SRAM with additional logic portions, where the logic and the embedded SRAM have NMOS transistors having a common gate dielectric thickness but have different lightly doped drain (LDD) implantations formed using different LDD masks to provide optimum transistor operation. In an embodiment, a first embedded SRAM is a single port device and a second embedded SRAM is a dual port device having a separate read port. In certain embodiments, the second SRAM includes NMOS transistors having LDD implants formed using the logic portion LDD mask. Transistors formed with the logic portion LDD mask are faster and have lower Vt than transistors formed using a SRAM LDD mask. Dual core devices having multiple embedded SRAM arrays are disclosed. Methods for making the embedded SRAM are also disclosed.

20 Claims, 16 Drawing Sheets

I/O devices 43

Device –1 for logic:
1. First gate oxide thickness
2. NLDD-1 MASK for NMOS LDD/pocket implant    45

Device-1 for SRAM cell-1 (single port SRAM):   47
1. The same gate oxide with Device-1
2. NLDD-1 MASK for SRAM NMOS LDD/pocket implant

Device-1 for SRAM cell-2 (2-Port 8T cell):   51
1. The same gate oxide with Device-1
2. NLDD-1 MASK for SRAM write port (6T)
3. NLDD-1 MASK for SRAM read-port (2T)

I/O device 43

Device –1 for logic 45
1. First gate oxide thickness
2. NLDD-1 MASK for NMOS LDD/pocket implant

Device-2 for SRAM cell-1(single port SRAM): 53
1. The same gate oxide with Device-1
2. NLDD-2 MASK for SRAMNMOS LDD/pocket implant

Device-2 for SRAM cell-2 (2-Port 8T cell): 55
1. The same gate oxide with Device-1
2. NLDD-2 MASK for SRAM write port (6T)
3. NLDD-2 MASK to cover SRAM read-port (2T)

I/O device 43

81

Device –1 for logic 45
1. First gate oxide thickness
2. NLDD-1 MASK for NMOS LDD/pocket implant

Device-2 for SRAM cell-1 (single port SRAM): 73
1. The same gate oxide with Device-1
2. NLDD-2 MASK for SRAMNMOS LDD/pocket implant

Device-1 for SRAM cell-2 (2-Port 8T cell): 71
1. The same gate oxide with Device-1
2. NLDD-1 MASK for SRAM write port (6T)
3. NLDD-1 MASK for SRAM read-port (2T)

FIGURE 8

I/O device 43

91

Device –1 for logic
1. First gate oxide thickness          45
2. NLDD-1 MASK for NMOS LDD/pocket implant Device-2 for SRAM cell-1 (single port SRAM):    73
1. The same gate oxide with Device-1
2. NLDD-2 MASK for SRAMNMOS LDD/pocket implant Device-1 & 2 for SRAM cell-2 (2-Port 8T cell):    77
1. The same gate oxide with Device-1
2. NLDD-2 MASK for SRAM write port (6T)
3. NLDD-1 MASK for SRAM read-port (2T)

FIGURE 9

I/O device 43

Core-1

Device –1 for logic  101
1. First oxide thickness
2. NLDD-1 MASK for NMOS LDD/pocket implant Device-2 for SRAM cell-1 (single port)  103
1. First oxide thickness
2. NLDD-2 MASK for SRAM-NMOS LDD/pocket implant Device-1 & 2 for SRAM cell-2: 2-Port 8T cell  105
1. First oxide thickness
2. NLDD-2 MASK for SRAM write port (6T)
3. NLDD-2 MASK for cover SRAM read-port (2T)

Core-2

Device –3 for logic  107
1. Second oxide thickness
2. NLDD-3 MASK for NMOS LDD/pocket implant Device-3 for SRAM cell-4: 2-Port 8T cell  111
1. First oxide thickness & NLDD-2 MASK for SRAM write port (6T)
2. Second oxide thickness & NLDD-3 MASK for SRAM read-port (2T)

1. STI formation
2. NMOS Vt and well dopant stage ( core ,or I/O, or both)
3. PMOS Vt and well dopant stage ( core ,or I/O, or both)
4. I/O gate dielectric formation
5. Core Gate dielectric formation
6. Gate conductive layer
7. SRAM Gate patterning
8. SRAM NMOS LDD-2
9. Logic NMOS LDD-1
10. SRAM PMOS LDD-2
11. Logic PMOS LDD-1
12. May have I/O NLDD and PLDD
13. Spacer
14. S/D formation

FIGURE 15

1. STI formation
2. NMOS Vt and well dopant stage (core, or I/O, or both)
3. PMOS Vt and well dopant stage (core, or I/O, or both)
4. I/O gate dielectric formation
5. Core-1 gate dielectric formation
6. Core-2 gate dielectric formation
7. Gate conductive layer
8. SRAM Gate patterning
9. SRAM NMOS LDD-2
10. Core-1 Logic NMOS LDD-1
11. Core-2 Logic NMOS LDD-3
12. SRAM PMOS LDD-2
13. Core-1 Logic PMOS LDD-1
14. Core-2 Logic PMOS LDD-3
15. May have I/O NLDD and PLDD
16. Spacer
17. S/D formation

EMBEDDED SRAM MEMORY FOR LOW POWER APPLICATIONS

This application claims the benefit of U.S. Provisional Application No. 61/243,896, entitled "Embedded SRAM Memory for Low Power Applications," filed on Sep. 18, 2009, which is incorporated herein by reference.

CROSS REFERENCE TO RELATED APPLICATION

This application relates to co-pending and co-owned U.S. patent application Ser. No. 12/748,098 entitled "Methods and Apparatus for SRAM Bit Cell With Low Standby Current, Low Supply Voltage and High Speed", Mar. 26, 2010, which claims the benefit of U.S. Provisional Patent Application Ser. No. 61/243,941, filed Sep. 18, 2009, both of which are hereby incorporated by reference in their entirety herein.

TECHNICAL FIELD

The present invention relates to SRAM memory bit cell structures embedded in an integrated circuit device and having low power requirements. The invention is directed to integrated circuits having SRAM arrays with multiple memory cell types embedded in one integrated circuit along with logic, processors, or other functions. A mixed transistor type SRAM bit cell is used to achieve low standby current leakage, and high access speed at low power, while remaining compatible with existing semiconductor processes and future semiconductor processes. Circuits and methods for providing an SRAM memory bit cell with improved standby leakage current (Isb) for improved standby operation, improved Vcc, min power for lowered supply levels, and high speed read access times are disclosed. The use of the invention provides advantages in an SRAM for use in a multiple core integrated circuit having logic circuitry and user specified circuitry thereon, in addition to SRAM arrays of SRAM bit cells, while the SRAM cells have improved stability and provide reliable operation over a wide range of conditions.

BACKGROUND

A current common requirement for an electronic circuit and particularly for electronic circuits manufactured as integrated circuits in semiconductor processes is an on-board or embedded array of memory storage elements. These elements may be provided as dynamic random access memory (DRAM) cells and alternatively as static random access memory cells (SRAM) cells. DRAM and SRAM memories are describes as "volatile" memory cells, in that if the power to the integrated circuit device is removed, the stored data will be lost. DRAM cells may be provided in very dense arrays, since a DRAM cell requires only a single access transistor and a storage capacitor, however DRAM circuits have relatively slow access time for reads and writes, and require somewhat complicated control circuitry, and each DRAM cell stores data as charge on a leaky capacitor, so that the DRAM array must be refreshed periodically to maintain state. This requires either that a processor periodically stop other operations and perform the refresh cycles, or that a dedicated memory controller (more often used in recently produced devices) perform the refresh cycles.

In contrast, SRAM memory arrays provide storage without the need for refresh cycles. SRAM arrays require more silicon area, since each bit cell is a latch typically formed of six transistors (6T) or more; however, the SRAM cells will retain data so long as an adequate supply voltage is present. Further advantages are that access times are very fast compared to DRAM cells, making SRAM cells particularly attractive as scratchpad or working data storage, such as cache memory for processors. Recent system on a chip (SOC) designs often incorporate one, two or more "cores". These cores are predesigned popular processors such as DSPs, ARMs, RISC or microprocessors, often arranged with a level one (L1) cache memory of SRAM cells laid out near or adjacent to the processor to make very fast processor operations possible. In many devices a dual-core approach is used; for example, a radio transceiver core may be provided with a microprocessor core. Several SRAM arrays may be used in such integrated circuits.

Increasingly, integrated circuits are used to implement functions in battery operated devices. For example, SOCs may be used to provide all or most of the circuitry needed to implement the main functions of a cellphone, laptop computer, netbook computer, audio or video player, camcorder or camera, smartphone or PDA. In these devices, customer defined logic or licensed processor core designs may be integrated with other predefined or macro cells such as microprocessors, digital signal processors, cores such as ARM, RISC or similar core functions, cell phone modules, and the like.

In an SRAM bit cell, data is stored on two storage nodes which are inversely related. A pair of CMOS inverters, formed of four MOS transistors, is arranged as a latch cell, each storage node being formed of the gate terminals of two MOS transistors and receiving the output of an inverter formed of two MOS transistors in complementary MOS (CMOS) technology.

FIG. 1 depicts a typical single port SRAM bit cell 10 in a six transistor (6T) arrangement. In FIG. 1, a pair of MOS pass gates PG1 and PG2 couple a pair of data lines referred to as "bit lines" BL and BLB to inversely related storage nodes SN1 and SN2, respectively. The pass gate transistors PG1 and PG2 are typically formed of NMOS transistors as is known in the art. A positive supply voltage Vdd, which may be from 0.6 Volts to 3.0 or more volts, depending on the technology node, is shown. Pull up transistors PU1 and PU2 are formed of PMOS transistors and couple the positive supply to one or the other storage nodes, depending on the state of the SRAM cell 10. A second supply voltage Vss, usually placed at ground, is shown.

Two pull down transistors PD1 and PD2, which are also usually NMOS transistors, couple this negative or ground voltage Vss to one or the other storage nodes labeled SN1 and SN2, depending on the state of the bit cell. The 6T SRAM bit cell is a latch that will retain its data state indefinitely so long as the supplied power is sufficient to operate the circuit correctly. Two CMOS inverters formed of PU1, PD1 and PU2, PD2 are "cross coupled" and they operate to reinforce the stored charge on the storage nodes SN1 and SN2 continuously. The two storage nodes are inverted one from the other, as shown in the figure. When SN1 is a logical "1", usually a high voltage, SN2 is at the same time a logical "0", usually a low voltage, and vice versa.

When the single port SRAM bit cell 10 is written to, complementary write data signals are placed on the bit line pair BL and BLB. A positive control signal on a wordline WL is coupled to the gate of both pass gates PG1 and PG2. The transistors PU1, PD1 and PU2, PD2 are sized such that the data on the bit lines may overwrite the stored data and thus write, or program, the SRAM bit cell 10.

When the SRAM bit cell 10 is read from, a positive voltage is placed on the word line WL, and the pass gates PG1 and PG2 allow the bit lines BL and BLB to be coupled to, and receive the data from, the storage nodes SN1 and SN2. Unlike a dynamic memory cell, the SRAM bit cell does not lose its stored state during a read if the power supply Vdd is maintained at a sufficiently high level, so no "write back" operation is required after a cell read.

The bit lines BL and BLB form a complementary pair of data lines. As is known to those skilled in the art, these paired data lines may be coupled to a differential sense amplifier (not shown); the differential voltage can be sensed and amplified, as is known in the art. This amplified sensed output signal may then be output as data to other logic circuitry in the device.

FIG. 2 depicts another form of a conventional SRAM bit cell 12 that uses 8 transistors (8T) and has an additional functionality in the form of a read port 14. Thus this configuration may be referred to as a dual port or two port (2P) 8T SRAM bit cell. In FIG. 2, the 6T cell 10 such as is shown in FIG. 1 is used. SRAM bit cell 12 additionally has a read port 14 of two NMOS transistors, read port pull down transistor RPD and read port pass gate transistor RPG. A read word line (RWL) is provided that is dedicated to "reads" only. The previous word line WL in FIG. 1 now becomes a write only word line WWL in the 8T cell 12 of FIG. 2. Thus the 2P bit cell has a write port and a separate read port. Advantages of a separate read port are that the possibility of "read disturbs" is reduced, because the data stored in the bit cell is not affected by the read operations; instead, the read pull down transistor RPD is either on or off, based on the storage node SN2 voltage that is coupled to the gate terminal of the transistor RPD. Because an NMOS transistor has gain, the stored data signal at SN2 is amplified by the gain of transistor RPD; and when the read word line RWL has a positive voltage placed on it, read pass gate transistor RPG turns on and couples the read bit line RBL to the read pull down transistor RPD, and the read port therefore outputs a corresponding data bit on the read bit line RBL.

In many applications, SRAM arrays of many bit cells are used that store data or programs for retrieval and use later. The SRAM cells may experience many more read operations than write operations in the same time period. Thus, it is very advantageous to have the read operations isolated from the bit cell by the read port circuit 14. This is true even though the 8T cell uses slightly more layout area in silicon to implement it. Further, when attempting to save power, the Vcc,min characteristic measurement becomes much more critical for the read circuitry, as that is the portion of the circuitry that is active most often.

FIG. 3 depicts another known SRAM cell 20 arrangement that uses ten transistors (10T). In this form, the circuit has two read ports, one coupled to each storage node SN1 and SN2 of the 6T cell 10. Each read port 22 and 24 has a separate control line (RWL1 and RWL2) and a separate pull down NMOS transistor and pass gate NMOS transistor. The two read bit lines RBL1 and RBL2 are coupled by the pass gate transistors RPG1 and RPG2 to the pull down transistors RPD1 and RPD2 respectively. The pull down transistors each have a gate terminal coupled with a respective storage node SN1 and SN2. The read operations may be performed independently or simultaneously. The use of the two read ports provides additional flexibility and allows two outputs to be read from the cell simultaneously.

FIG. 4 depicts a bit cell layout for the single port, 6T bit cell 10. In FIG. 4, an N type well is formed in a semiconductor substrate, which may be, for example, a P-type substrate, or a P doped epitaxially formed silicon layer over an insulator (SOI). The dashed areas depict the polysilicon gates, contacts are shown and the active areas 31 are shown for the NMOS and PMOS transistors. The transistors are labeled at their gates; PG-1, PG-2, PU-1, PU-2, PD-1, and PD-2 form the 6 T single port bit cell. The cell has a pitch labeled Y1-pitch in the Y direction and a pitch labeled X1-pitch in the X direction. The contacts are labeled with the appropriate signal, word line contacts are formed for both the PG-1 and PG-2 transistors, and the cell area is defined to include these contacts and the bit line and power contacts. Two storage nodes are formed in the bit cell. The layout corresponds to the SRAM bit cell 10 of FIG. 1.

Similarly, a layout for the two port 8T bit cell 12 is depicted in FIG. 5. In this cell layout, the read port is added to the single port. Active areas 31 are shown. The same 6 transistors PG-1, PG-2, PU-1, PU-2, PD-1, and PD-2 are shown now forming the write port and in addition, the layout includes the read port transistors RPG-1 and RPD-1. The read bit line and read word line contacts are shown at the right end of the cell. An N well is formed to form the channel for the two PMOS pull-up transistors, the remaining NMOS transistors are formed in a P-type substrate. The cell has a Y direction pitch labeled Y2 pitch, and an X direction pitch labeled X2-pitch.

The SRAM arrays are combined with other functions to form a "core". A design core is a functional block that may be used in a standardized design approach by placing it on an integrated circuit along with other user defined functions to define a new integrated circuit. Because the design core is completely understood and verified for manufacture already, and is typically calibrated to one or more semiconductor processes provided by, for example, a semiconductor foundry, the use of these cores allows a new functional device to be rapidly and inexpensively implemented. Because many of the design cores include a processor, microprocessor, digital signal processor or other computing function, SRAM memory is often also included. The SRAM may be broken into a general purpose data store and a level one (L1) cache. Cache memory may store instructions or data that the processor has used or expects to use soon or that is to be reused. For example, this occurs while executing a loop operation. The use of cache memory reduces the time the processor must wait for words to be retrieved from an off chip memory location. The use of embedded SRAM cache memory on board the integrated circuit and placed near the processor or logic function allows very rapid retrieval of necessary data words or program instructions, thus providing additional processor performance.

FIG. 6 depicts in a block diagram the functional blocks of a single core integrated circuit 41 with embedded SRAM arrays. In FIG. 6, a first portion of the transistor devices (and there are thousands of transistors on a state of the art integrated circuit) is used to form input output or I/O devices 43. Because the I/O devices are coupled to external pins and signal traces and have to drive larger currents, these transistors are usually formed using larger area devices with higher gains and thicker gate dielectrics to carry additional current. A second portion of the integrated circuit 41 is logic 45. Since the logic transistors need to have high speed and low power consumption, these devices may be small, have thinner gate dielectrics than the I/O portion, and may have lower threshold voltages. Threshold voltages may be adjusted using implants including, for example, the lightly doped drain (LDD) ion implants and additional pocket implants to tailor the device characteristics, as is known in the art.

A first single port embedded SRAM array 47 is shown in FIG. 6. The conventional methods for processing such a device use the same gate dielectric material and the same implant processing for the SRAM bit cells as that used in the logic portion 45. A second embedded SRAM array 51, this one a two port 8T bit cell array (2P-8T), is shown. Again the conventional method for producing this single core integrated circuit is to use the same gate dielectric and the same LDD and pocket ion implant masks to complete all portions of the device.

FIG. 7 depicts an alternate approach to a single core integrated circuit 51 with embedded SRAM known in the art. In this block diagram, again there is a portion 43 that is for I/O devices. A second portion 45 is provided that has logic devices, with transistors formed using logic rules for a gate dielectric (first gate oxide thickness) and an NMOS LDD Mask for LDD ion implantation and pocket implant steps. In FIG. 7, an SRAM portion 53 is shown which is a first embedded SRAM array. This array 53 is a single port SRAM formed using a set of SRAM design rules, including the same gate dielectric as before, but now using a second NMOS LDD mask (NLDD-2) for the SRAM transistors for LDD and pocket ion implant steps.

Further, in FIG. 7, a portion 55 is provided with a second embedded SRAM array formed using the same gate dielectric thickness and having the second NMOS LDD-2 mask step for the 6T write transistors and for the 2T read port transistors. Using the different implant masks for the LDD and pocket implants allows the process to form transistors for the logic portion transistors and in the transistors for the SRAM portions with different performance characteristics on the same core.

Recently, the dual port 8T SRAM cell has become very popular for implementing level 1 (L1) cache in a core. The need to lower the power, and especially the standby power, of the SRAM arrays has also become an issue. As semiconductor processes advance and device sizes continue to shrink, the ability to reduce power consumption has reached critical limitations. The SRAM array needs to be stable and retain data, however the usual approach of continuously lowering the supply power to reduce power (Vcc,min) is not compatible with the goals of stability and reducing standby leakage current Isb.

The continuing and increasing demand for low power integrated circuits, particularly for more complicated battery powered, portable devices, requires that SRAM cells have good power consumption characteristics. One measure of the power consumption is the standby leakage current Isb. When the SRAM cell is not being used, the SRAM array may be placed in a standby mode. The leakage current consumed during standby, Isb, should be minimized. Further, it is known in the art to reduce power consumed in CMOS circuitry during standby mode by reducing the positive power supply as far as possible. The metric used to determine this potential is referred to as "Vcc, min.". It is clearly advantageous to provide SRAM cells with a low Vcc,min value. This is difficult to do reliably for the 6T storage cells, however, due to process variations and other constraints increasingly imposed by shrinking device sizes.

Thus, there is a continuing need for a single or dual core integrated circuit either improved embedded SRAM bit cell structures that has a lower standby leakage current Isb; improved Vcc,min for lower standby power, and improved access speed particularly during read operations, while remaining compatible with state of the art semiconductor processes for fabricating integrated circuits, without adding significant steps or significant added costs.

SUMMARY OF THE INVENTION

These and other problems are generally solved or circumvented, and technical advantages are generally achieved by embodiments of the present invention, which provides in a first exemplary embodiment a single core integrated circuit with embedded SRAM bit cells having multiple design rules, to provide different transistor characteristics within one SRAM array, or different transistor characteristics within the embedded SRAMs in a single core with multiple SRAM arrays. The use of different NMOS lightly doped drain (LDD) and pocket implant masks for different portions of the integrated circuit allows some SRAM bit cells to be implemented using the logic design rule transistor characteristics, while other SRAM bit cells are implemented using SRAM device design rules to achieve different characteristics.

In another embodiment, a dual core integrated circuit, with each core having at least one embedded SRAM array, is provided. In this exemplary embodiment, one core of the dual core integrated circuit may be formed using a first gate dielectric, while the second core may be formed using a second gate dielectric. Further, the use of multiple NMOS LDD implant and pocket implant masks enables the formation of SRAM bit cells that are formed using logic design rules, and SRAM design rules, in each of the two cores. By varying these approaches a range of embodiments is available to allow for low standby power, reduced leakage current, and stable embedded SRAM arrays. The use of different implant steps allows the threshold voltage Vt of the transistors to be controlled. Strong Vt devices may be used in some portions and weaker Vt devices may be used in other portions of the SRAM bit cells.

In yet another exemplary embodiment, a single core integrated circuit is provided with triple gate dielectric materials, different gate oxide thicknesses being used in the I/O, logic and SRAM portions. In one alternative embodiment, the single core integrated circuit has a single port SRAM array that has a thicker gate dielectric, while another dual port SRAM array has a thinner gate oxide thickness in a read portion, while the remaining portion has the thicker gate dielectric.

Further embodiments include a dual core integrated circuit that has embedded SRAM arrays that are both single port and dual port SRAM arrays. The single port SRAM arrays may be formed using thicker gate dielectrics for improved standby leakage current. The dual port SRAM arrays may be formed using the thicker gate dielectrics in the storage bit cell portion, while the read portion transistors are fabricated using the thinner gate dielectrics of the logic portions. In addition, several different NMOS LDD and implant masks may be used to further tailor the transistors in each portion for optimal performance by varying the Vt of the devices.

This summary gives an overview of certain embodiments of the invention, and is not limiting. Additional features and advantages of the invention will be described hereinafter, which form the subject of the claims of the invention. It should be appreciated by those skilled in the art that the conception and specific embodiment disclosed might be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE FIGURES

For a more complete understanding of the present invention, and the advantages thereof, reference is now made to the following descriptions taken in conjunction with the accompanying drawings, in which:

FIG. 6 illustrates in a block diagram a prior art integrated circuit with embedded SRAM arrays;

FIG. 7 illustrates in a second block diagram a prior art integrated circuit with embedded SRAM arrays;

FIG. 8 illustrates in a block diagram an exemplary embodiment of the invention;

FIG. 9 illustrates in a block diagram another exemplary embodiment of the invention;

FIG. 11 illustrates in a block diagram yet another exemplary embodiment of the invention;

FIG. 15 illustrates a method embodiment of the invention; and

FIG. 16 illustrates another method embodiment of the invention.

Figure 1:
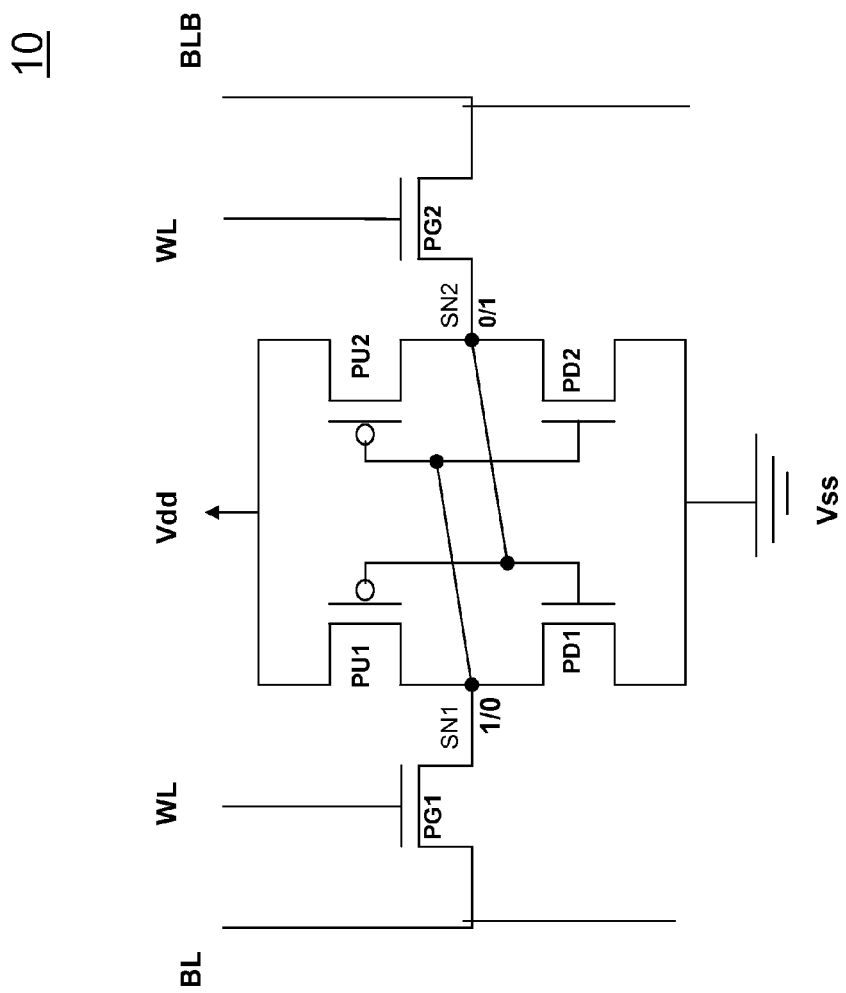
FIG. 1 illustrates a prior art SRAM bit cell circuit.
Figure 2:
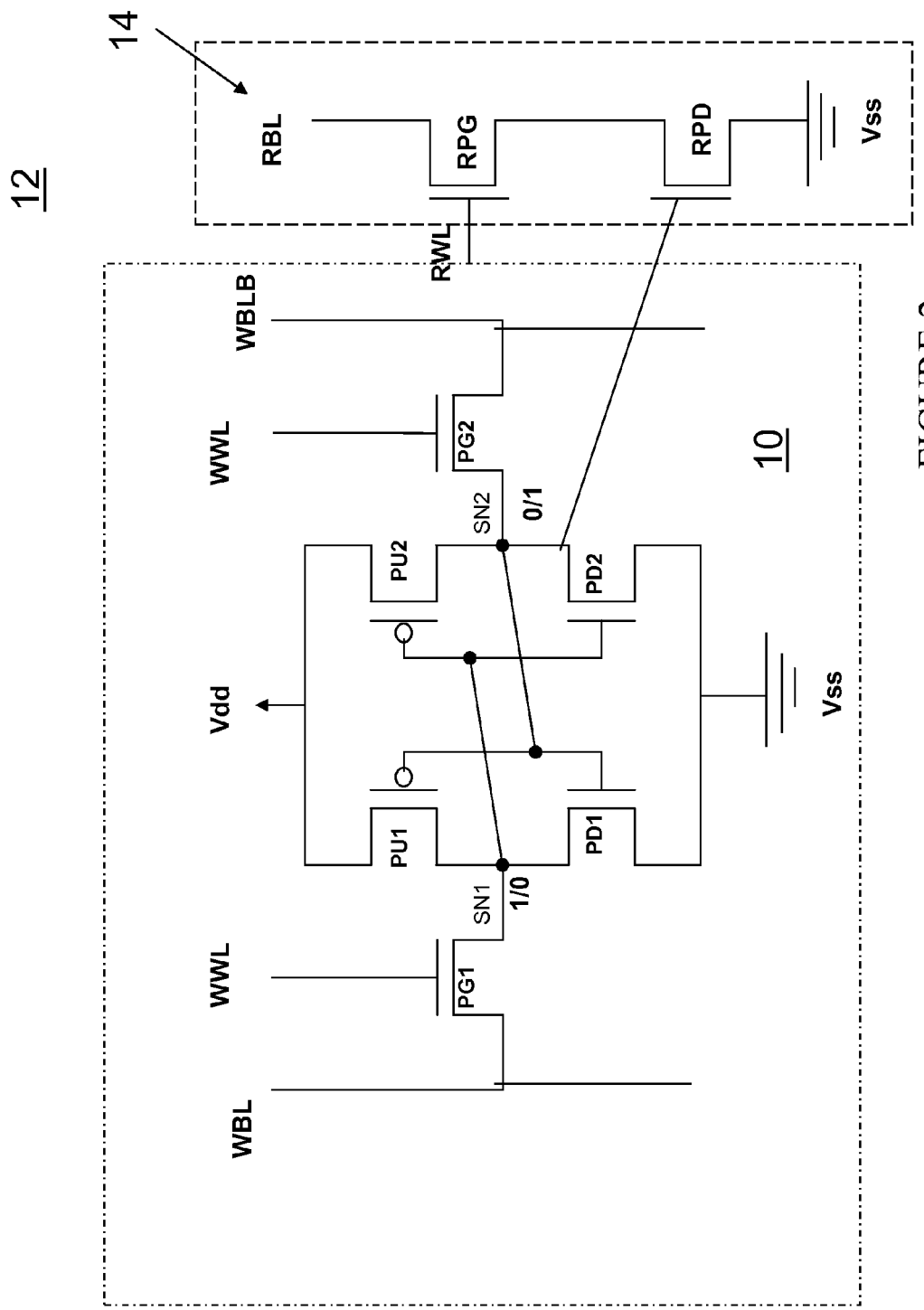
FIG. 2 illustrates a prior art 8T SRAM bit cell circuit.
Figure 3:
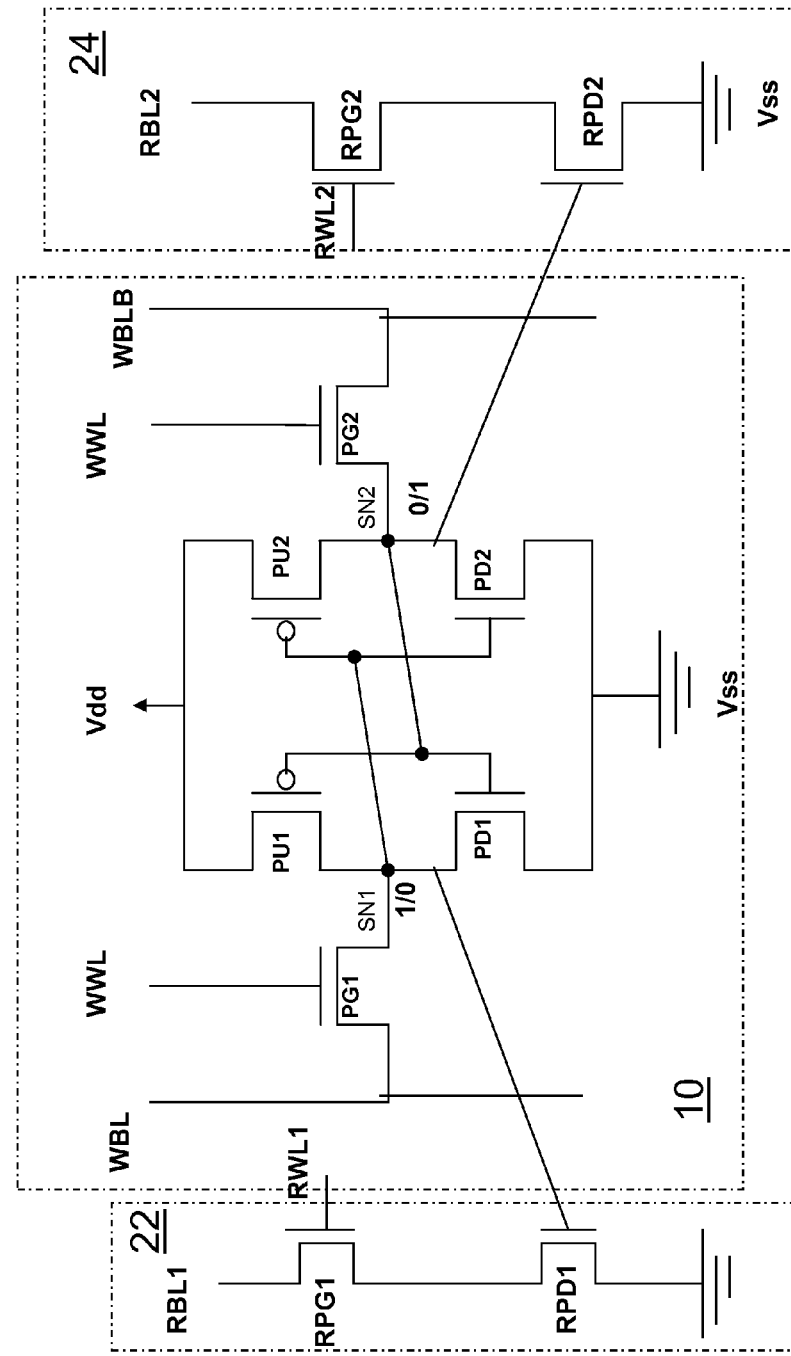
FIG. 3 illustrates a prior art 10T SRAM bit cell circuit.
Figure 4:
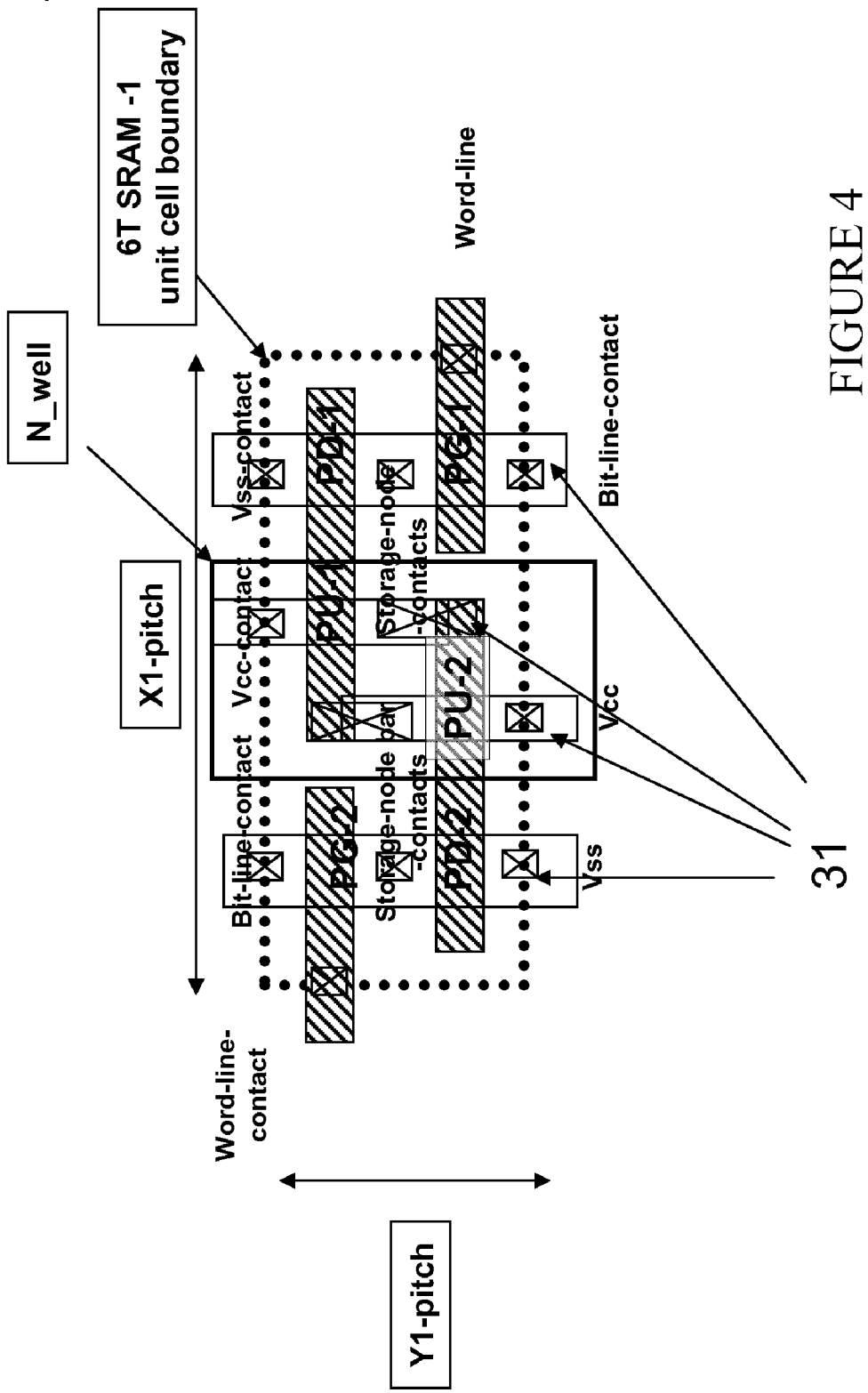
FIG. 4 illustrates in a simple layout diagram the layout of an SRAM bit cell circuit.
Figure 5:
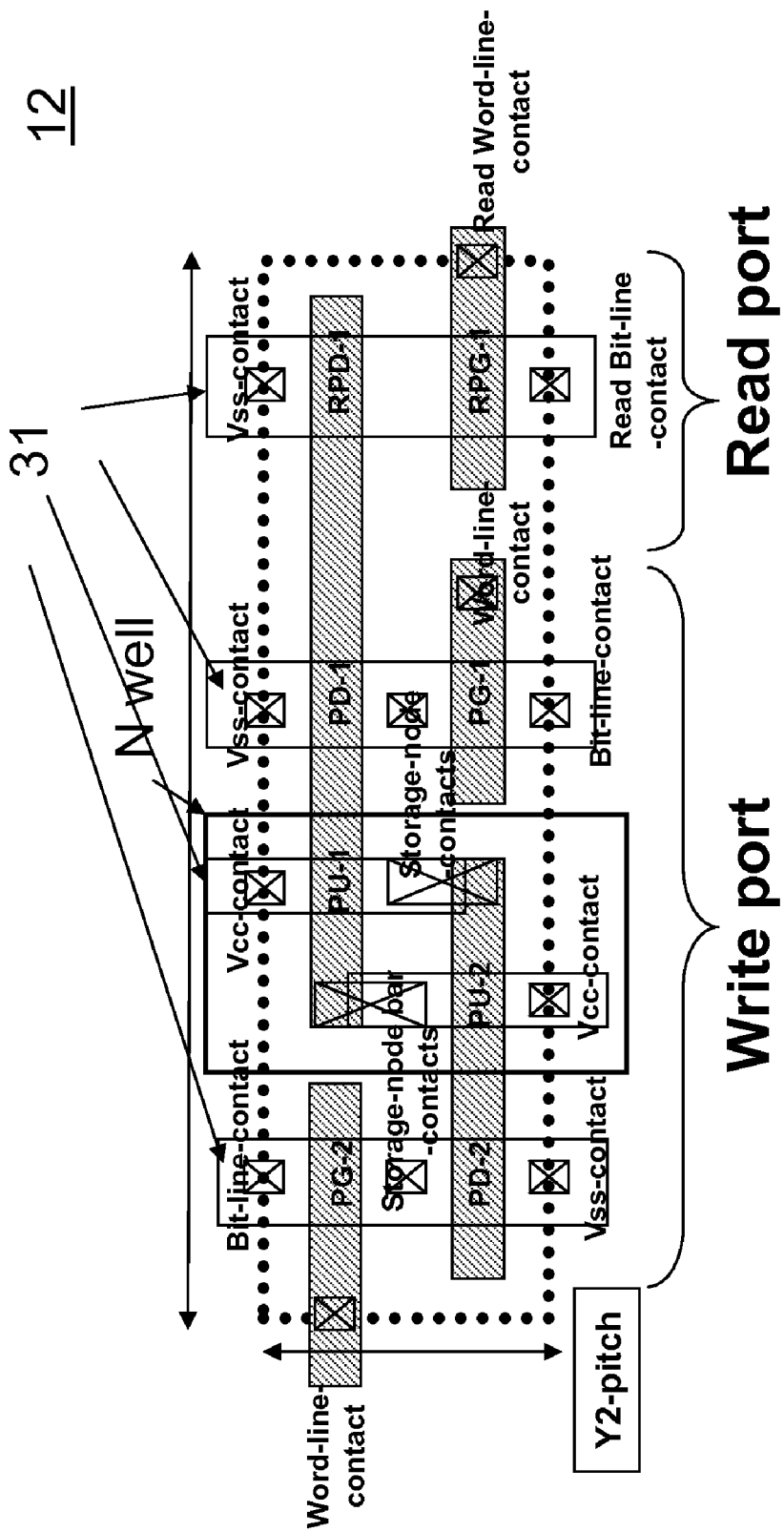
FIG. 5 illustrates in another simple layout diagram the layout of an SRAM 8T bit cell circuit.

The drawings, schematics and diagrams are illustrative and not intended to be limiting, but are examples of embodiments of the invention, are simplified for explanatory purposes, and are not drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

FIG. 8 illustrates in one exemplary embodiment a block diagram where a single core integrated circuit 81 is provided using both logic transistor design rules and SRAM transistor design rules in embedded SRAM arrays in the same core. In FIG. 8, the I/O devices are formed with a first set of design rules for gate dielectric thickness, and a logic portion 45 is again provided with a second set of "Device-1" design rules using a gate oxide dielectric (which may include, for example, oxides, nitrides, oxynitrides, silicon dioxide, and the like as dielectric materials) of a first thickness and a first NMOS LDD mask (NLDD-1) is used. This is referred to herein as a dual gate oxide (DGO) process. The use of different LDD masks and implant steps allows control of the transistor Vt (threshold voltage). In the SRAM storage cell, a higher Vt device may be desired while in the read port of the dual port cells, a lower Vt device may provide better speed and lower power. In an embedded SRAM array 71, a dual port embedded SRAM array is formed also using the Device-2 design rules and a second LDD mask, NLDD-2. In a second embedded SRAM array 73, however, a single port SRAM bit cell array is formed using a second set of design rules labeled "Device 1". The use of these implant steps from the logic portion in the SRAM array provides additional performance and design flexibility with little added costs, as these implant masks and steps are already in use for the logic portions.

Thus, in this embodiment, embedded SRAM cells with different transistor characteristics are formed, using different NMOS LDD masks and implantation steps, within a single core on an integrated circuit. By using the different process and design rules for the SRAM portions, an embedded SRAM design may be arranged to optimize the threshold voltage, speed, standby leakage current and stability of the SRAM cells, which is particularly important when low power and high speed are required.

FIG. 9 illustrates another exemplary embodiment block diagram of an integrated circuit 91 having multiple design rule embedded SRAM bit cells in a single core. In FIG. 9, the I/O device 43 portion is again provided, and the logic device portion 45 has transistors formed with "Device-1" rules for the gate dielectric thickness and the NMOS LDD implant and pocket implants. An SRAM bit cell array with a single port 73 is provided with "Device-2" design rules, while in the dual port embedded SRAM array 77, a different approach is used. In this embodiment, the dual port array 77 has two different NMOS LDD masks and implants used. For the 6T bit cell transistors in the "write" portion of the circuit, the Device-2 or SRAM design rules are used. These transistors are formed using the same gate dielectric thickness as the logic portion 45 but with the NMOS LDD maskNLDD-2 for the LDD and pocket implants. This is the same mask as used for the single port SRAM array 73. However, the read port transistors in the 2T portion of the SRAM bit cells in embedded array 77 are now formed with the Device-1 or logic design rules, using the NMOS LDD-1 mask for LDD ion implant and pocket ion implants. This is the same as the one used for the logic portion above. In this manner, the array 77 of 2P8T cells has two different transistor device characteristics within each SRAM bit cell, one for the 6T write portion, and another transistor type for the read portion transistors of the 8T cell. This feature is particularly advantageous as the read transistors can be made higher speed devices, while the storage node transistors remain reliable and stable with low standby leakage current.

Figure 10:
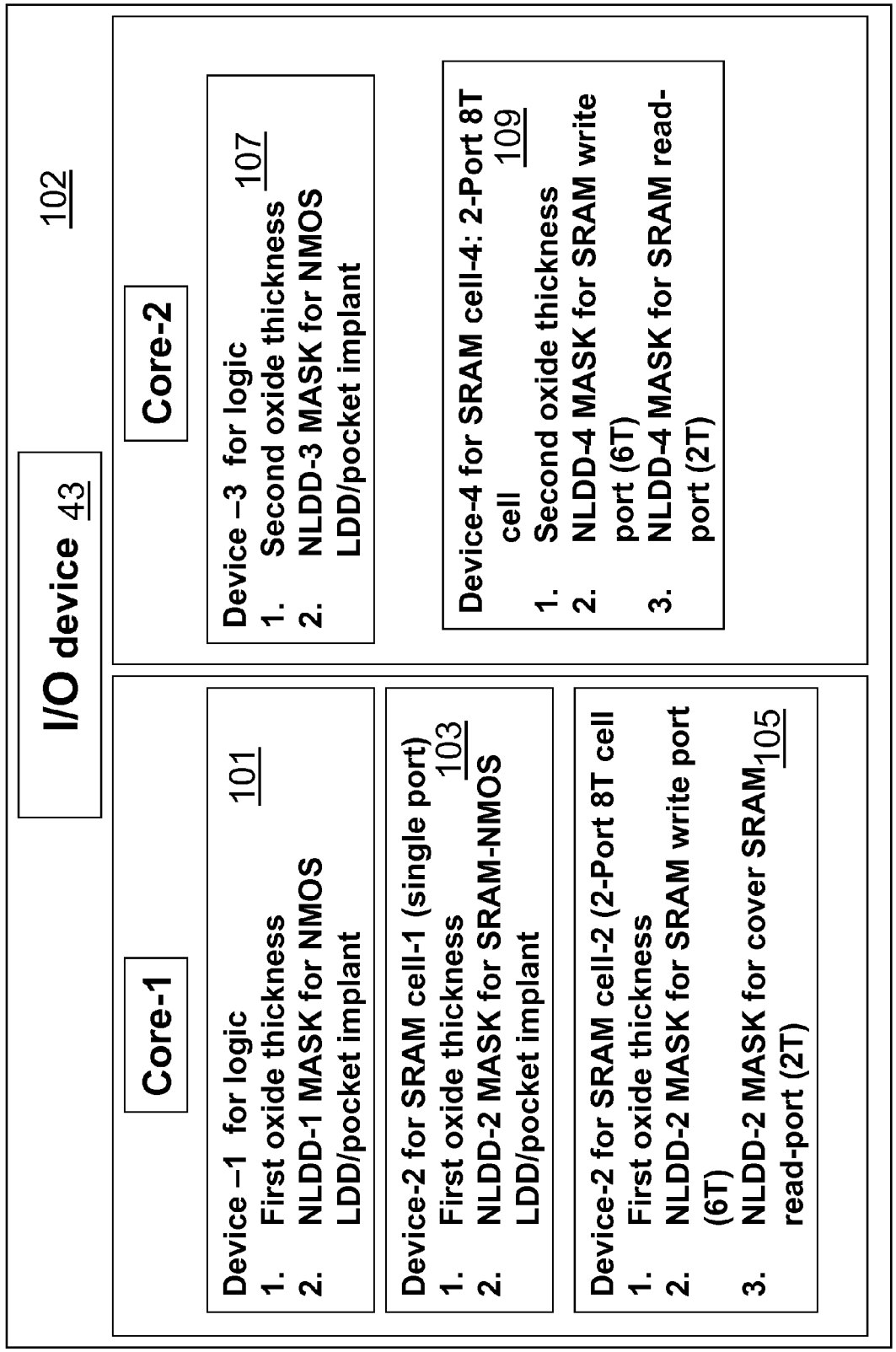
FIG. 10 illustrates in a block diagram yet another exemplary embodiment of the invention.

FIG. 10 depicts, in another exemplary embodiment block diagram, an integrated circuit 102 having dual core devices Core-1 and Core-2 that incorporate the features of the invention. In this dual core device, a first core Core-1 has three portions, a logic portion 101 with first "Device 1" design rules for gate dielectric thickness, and an NMOS LDD-1 mask for LDD and pocket implants. Within Core-1 are also two embedded SRAM arrays, a single port SRAM array 103, and a dual port SRAM array 105. Each of these arrays are formed using a second set of "Device-2" design rules for transistors. In a second core, Core-2, another logic portion 107 is implemented, with a second gate dielectric thickness that is different from the first dielectric thickness, and a third NMOS LDD mask NLDD-3 that determines the LDD and implant process; and finally another embedded SRAM array 109 is formed in a portion of Core-2. Array 109 is an embedded SRAM of dual port 8T bit cells, with the second gate dielectric thickness for the transistors, and using a fourth NMOS LDD mask NLDD-4 for the LDD and pocket implant processes. In this manner, within one integrated circuit 102, embedded SRAM arrays with a first and a second gate dielectric thickness, and with different NMOS LDD masks, are provided. Each SRAM array that is embedded in the integrated circuit may have transistor characteristics that are different from the other portions of the circuit so that the standby leakage current Isb, the minimum supply voltage Vcc,min and the read access speed may be optimized for the application. Because three different oxide thicknesses are used in the method to this embodiment, it is a triple gate oxide (TGO) process.

FIG. 11 depicts in another exemplary embodiment a dual core integrated circuit 110 having a first core Core-1 with a logic portion 101 having "Device-1" design rules for gate dielectric thickness and for the NMOS LDD mask NLDD-1 for LDD formation and pocket implants, a single port SRAM portion 103 having a second "Device-2" set of design rules for the transistors having the same first gate dielectric thickness and using a second NMOS LDD mask NLDD-2 for the LDD and pocket implant process, and a dual port embedded SRAM array 105 with a first gate dielectric thickness and using the second NMOS LDD mask NLDD-2Mask for both the 6T write portion transistors and the 2T read portion transistors of the dual port bit cells. On the same integrated circuit 110, a second core Core-2 is formed with logic portion 107 with a second gate dielectric or oxide thickness and a third NMOS LDD mask NLDD-3 is used for the LDD and pocket implant processes, with "Device-3" logic design rules, and another embedded SRAM array 111. Array 111 is a dual port SRAM bit cell array with the 6T write portions formed using the first oxide thickness and the NMOS LDD-2 mask for the SRAM transistors in the write port, and the second gate dielectric or oxide thickness and an NMOS LDD-3 mask for the read portion of the 8T SRAM array. In this exemplary embodiment the dual port SRAM array 111 has a gate dielectric and LDD mask NLDD-2 that provides good stability, and low standby leakage in the write portion and storage nodes of the SRAM bit cells in the array, while the read portion of the bit cells is formed using the logic gate dielectric thickness for the logic in Core-2, the "Device-3" rules; and the NMOS LDD-3 mask is used for the read port transistors.

Figure 12:
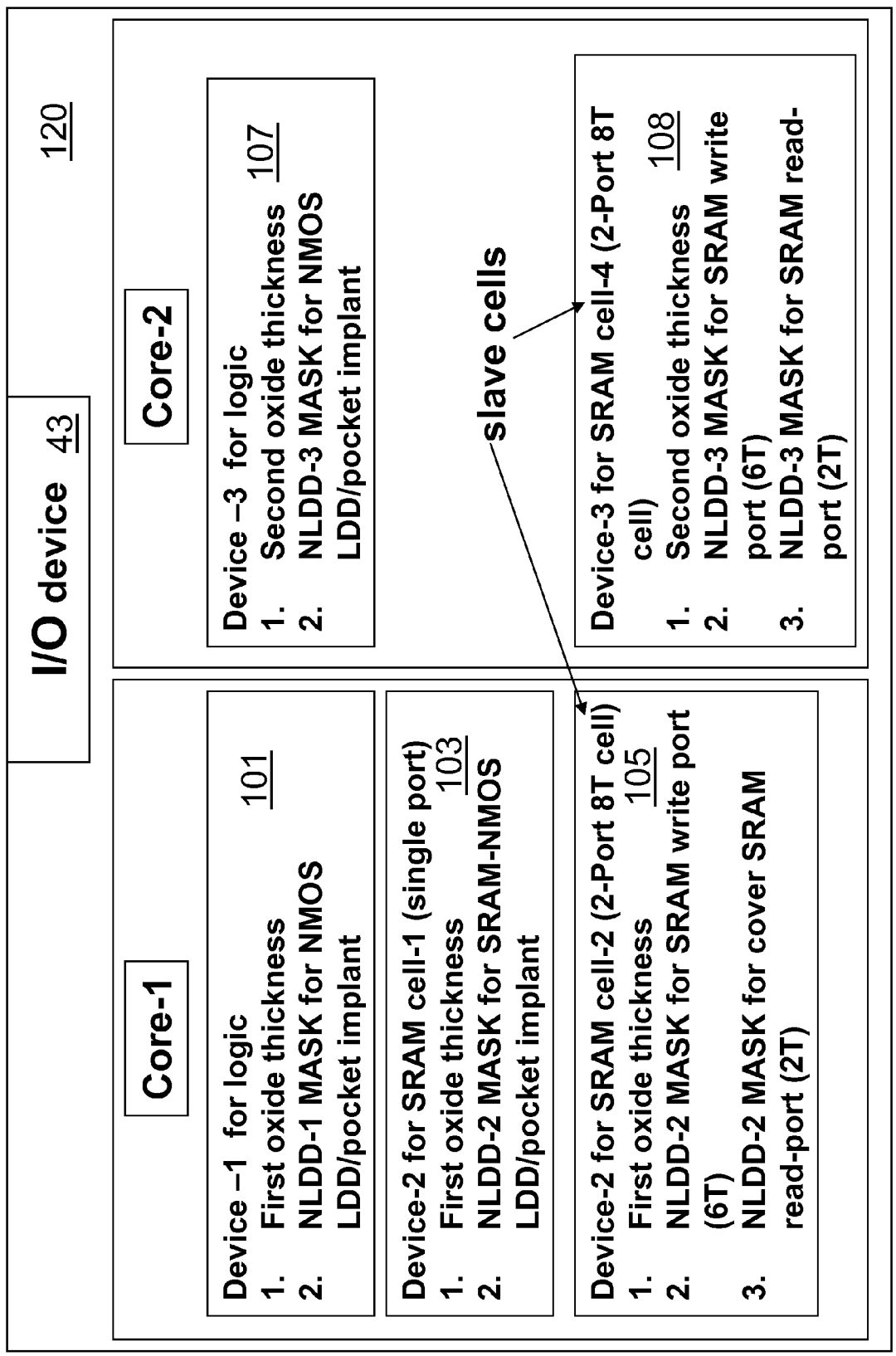
FIG. 12 illustrates in a block diagram still another exemplary embodiment of the invention.

FIG. 12 illustrates an integrated circuit 120 embodiment with a dual core arrangement. In Core-1 is a logic portion 101 having a first gate dielectric thickness and using a first NMOS LDD mask NLDD-1 for LDD and pocket implants. The single port SRAM cell array 103 is formed using the first gate dielectric thickness but using a second NLDD mask NLDD-2 for forming the LDD and pocket implant. A dual port embedded SRAM array 105 is then provided with the first gate dielectric thickness. The write portion 6T transistors and the read portion transistors are formed using the NLDD-2 mask for SRAM for LDD and pocket ion implants. Integrated circuit 120 has a second core, Core-2, which includes a logic portion 107 formed with a second gate dielectric thickness and using a third NLDD mask, NLDD-3, to form the LDD and pocket implants. Core 2 also comprises an embedded SRAM device that is a dual port SRAM bit cell array 108. The dual port array 108 includes the second gate dielectric thickness and uses the NMOS LDD mask NLDD-3 in both the SRAM write port transistors, and the SRAM read port transistors, for each bit cell. The integrated circuit device 120 thus includes in the same device embedded SRAM bit cells with two different gate dielectric thicknesses and two different LDD and pocket implants, to allow the transistor characteristics such as the threshold voltage to be optimized for each portion of the circuit.

Figure 13:
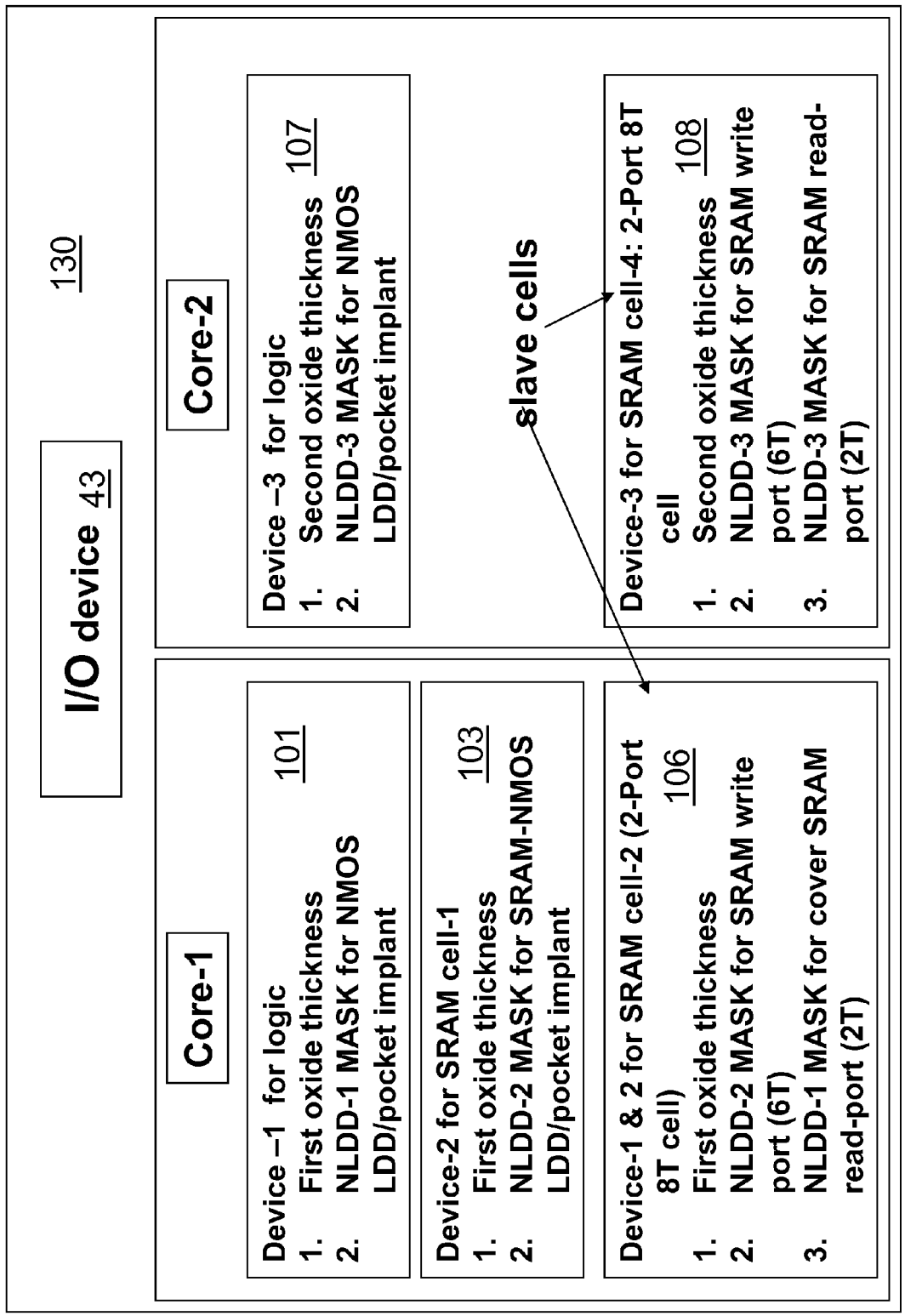
FIG. 13 illustrates in a block diagram yet another exemplary embodiment of the invention.

In FIG. 13, another exemplary embodiment integrated circuit 130 is shown in a block diagram. In this embodiment, again a dual core arrangement is provided. Core 1 includes logic portion 101 having a first gate oxide thickness and using a first NMOS LDD mask NLDD-1 for the LDD formation and the pocket implants. A single port embedded memory array 103 is provided with the first oxide thickness but using a second NLDD mask, NLDD-2, for the LDD formation and the pocket implants. A dual port embedded SRAM array 106 is provided with the first gate oxide thickness. However, in this arrangement, the dual port SRAM array has the write portion transistors formed using the NLDD-2 mask, for SRAM LDD and pocket implant, while the read portion is formed using the NLDD-1 mask, for logic. In Core 2, a second oxide thickness is used for both the logic portion 107 and the embedded SRAM 109, and the NMOS LDD mask NLDD-3 is used for both the write and read portions of the dual port SRAM 108. Thus, the integrated circuit has, in Core 1, dual port SRAM 106 which uses two different NLDD masks in the same bit cell so the transistors in the write portion have different characteristics than those in the read portion of the bit cells, while Core 2 has an SRAM array with a second oxide thickness that is different than that in Core 1.

Figure 14:
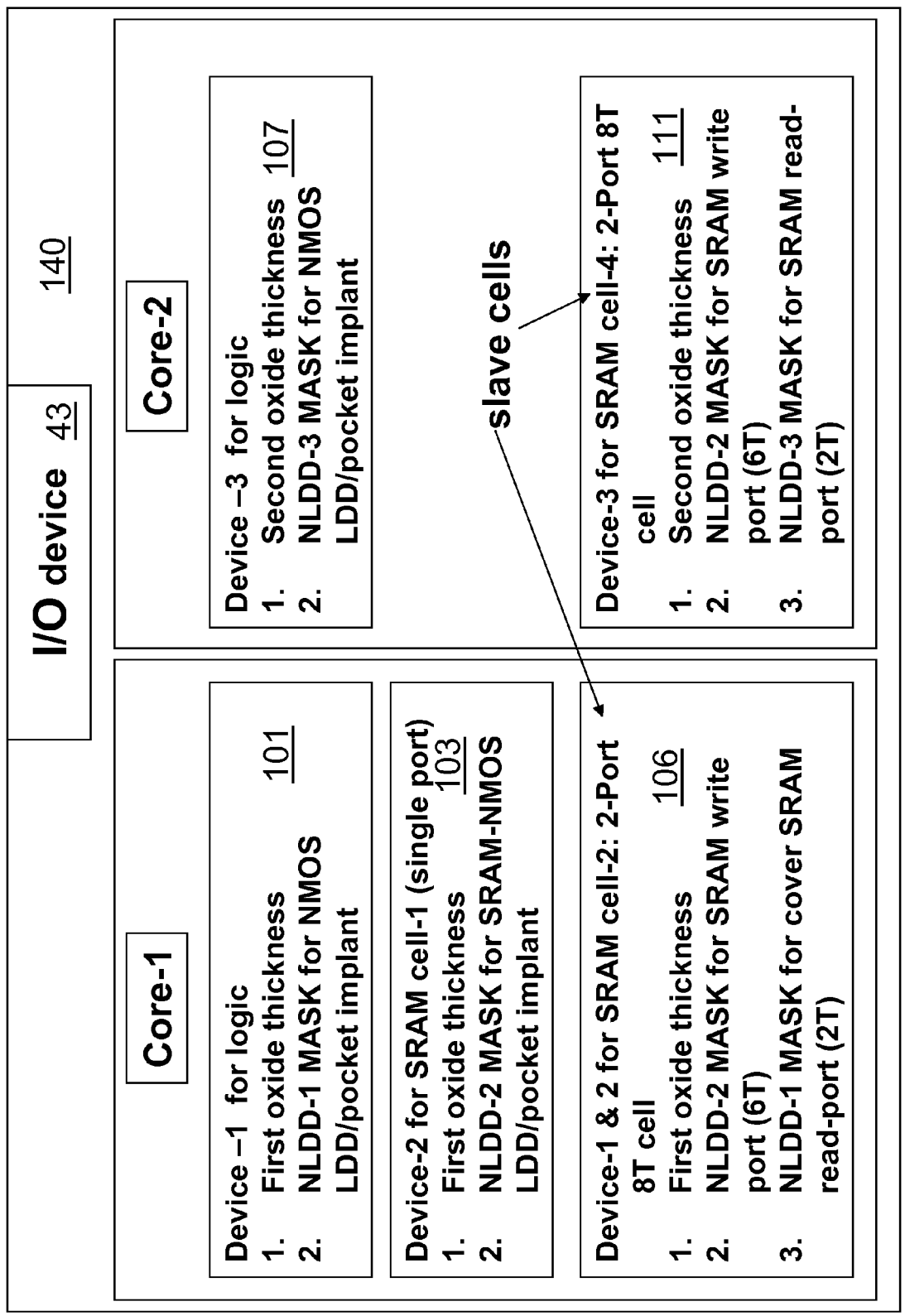
FIG. 14 illustrates in another block diagram yet another exemplary embodiment of the invention.

FIG. 14 depicts yet another exemplary embodiment of an integrated circuit 140 with a dual core arrangement of Core 1 and Core 2. In Core 1, the logic portion 101 is as before. A single port array 103 has the first gate oxide thickness but has a second NMOS LDD mask NLDD-2. In embedded array 106, a dual port SRAM array of bit cells is formed using the first oxide thickness but using the second NLDD mask NLDD-2 for the write portion of the array, and using the first or logic device NLDD mask NLDD-1 for the read portion of the array. The second core, Core 2, of the integrated circuit in this exemplary example has a logic portion 107 with a second oxide thickness and a third NLDD mask NLDD-3, and an embedded SRAM array that is a dual port SRAM with 8T cells 111. Array 111 also has the second oxide thickness and uses two different NMOS LDD masks, the write portion or 6T transistors use the NLDD-2 or SRAM mask for LDD and pocket implants, and the read portion uses the NLDD-3 mask, the same as used for the logic portion of Core 2. Thus, in this embodiment, the integrated circuit 140 has two embedded SRAM arrays that are dual port arrays, each having two different NLDD masks, one for the write portion and storage node, and one for the read portion, which allows the dual port SRAM arrays to be optimized for low standby leakage current, and fast access times.

The figures above are presented to illustrate that many combinations of the embodiments and features may be made. Additional combinations of the features described will result in additional alternative embodiments that are contemplated as part of the present invention.

FIG. 15 illustrates the steps in a process embodiment a method for making the dual core devices incorporating features of the invention. In FIG. 15, a semiconductor substrate is provided. In step 1, shallow trench isolation (STI) regions are formed defining active areas in the substrate. In step 2, doping is performed to form wells and to control the threshold voltage (Vt) for NMOS devices. In step 3, PMOS dopant and PMOS wells are formed. In step 4, the first gate dielectric is deposited for the I/O regions. In step 5, the second gate dielectric is formed, thus this is a dual gate oxide (DGO) process. The gate dielectric or gate oxide may be any of the gate dielectrics used in the current semiconductor processes and any contemplated for future processes including silicon oxide, dioxide, oxynitride, and high k dielectrics such as those containing hafnium and zirconium. In step 6, the gate conductive layer is deposited. Typically polysilicon is used but metal gates and other gate conductors may also be used. In step 7, the gate patterning step is performed; this is a photo resist and etch step to form the gate conductors. In step 8, a first NMOS LDD (lightly doped drain) implant is performed using the NMOS LDD-2 mask. Angled or pocket implants are also performed using ion implantation and the same mask. The logic transistor NMOS LDD step is then performed in step 9 using the NMOS LDD-1 mask. In step 10, the PMOS SRAM LDD is performed using a PMOS LDD-1 mask. In step 11, the PMOS logic transistor LDD is performed using the LDD-1PMOS mask. Step 12 is an optional step but some designs may also use I/O NLDD and PLDD masks that are different from the logic and SRAM LDD masks for LDD implantation. After the LDD regions are formed and the pocket implants are complete, gate spacers are formed using oxides, nitrides, and oxynitrides to protect the sidewalls of the gate conductors. The deeper implants to form the source and drain regions needed to complete the transistors are then performed.

The process steps in FIG. 15 provide one method for the dual gate oxide devices. The I/O portion and the remainder of the integrated circuit have two different dielectric thicknesses. FIG. 16 depicts process steps for the triple gate oxide (TGO) devices described above. In FIG. 16, the process begins in step 1 with STI formation. In step 2, the NMOS Vt and well dopants are implanted in certain areas. In step 3, the PMOS Vt and well dopants are implanted. In step 4, the I/O region dielectrics are deposited. In step 5, the gate dielectric for Core-1 is deposited. In step 6, a new step, the gate dielectric layer for Core-2 is deposited. In step 7, the gate conductive layer, polysilicon for example, is deposited. In step 8, gate patterning is performed. In step 9, the SRAM NMOS LDD mask LDD-2 is used for LDD and pocket implants. In step 10, the Core 1 logic LDD is performed with the LDD-1NMOS mask. In step 11, the Core 2 logic LDD process is performed using LDD mask LDD-3. In step 12, the first PMOS LDD process is performed using mask PMOS LDD-2 for SRAM cells. In step 13, the Core-1Logic PMOS LDD process is performed using an LDD mask PMOS LDD-1. In step 14, the Core-2Logic PMOS LDD process is performed, using a mask PMOS LDD-3. An optional step 15 may also use additional LDD masks for the I/O LDD; alternatively, these may be formed with one of the other LDD steps. Gate spacers are formed on the gate conductors in step 16. In step 17, the deeper source and drain or S/D implants are performed to complete the transistors.

While the above steps are described in an order, the steps may be reordered and steps may be combined as additional alternative embodiments of the methods, and these are still within the scope of the invention The gate dielectrics may be conventional ones such as silicon oxide, silicon dioxide, silicon nitride, silicon oxynitride and other silicon containing dialectics as known in the art. High-k gate dielectrics may be used. For example, in some embodiments of the present invention, dielectrics including hafnium, zirconium, with or without silicate and oxygen, may be used.

Although exemplary embodiments of the present invention and its advantages have been described in detail, it should be understood that various changes, substitutions and alterations can be made herein without departing from the spirit and scope of the invention as defined by the appended claims. For example, it will be readily understood by those skilled in the art that the methods may be varied while remaining within the scope of the present invention.

Moreover, the scope of the present application is not intended to be limited to the particular embodiments of the methods and steps described in the specification. As one of ordinary skill in the art will readily appreciate from the disclosure of the present invention, processes, or steps, presently existing or later to be developed, that perform substantially the same function or achieve substantially the same result as the corresponding embodiments described herein may be utilized according to the present invention. Accordingly, the appended claims are intended to include within their scope such processes or steps.

What is claimed is:

1. An apparatus, comprising:
a semiconductor substrate;
an I/O portion comprising transistors having a first gate dielectric thickness;
a core, comprising:
a logic portion having transistors with a second gate dielectric thickness and having lightly doped drain (LDD) implantations formed using a first LDD mask;
a first SRAM portion having transistors with the second gate dielectric thickness and having lightly doped drain (LDD) implantations formed using a second LDD mask different from the first LDD mask; and
a second SRAM portion having transistors with the second gate dielectric thickness and having at least one transistor with lightly doped drain (LDD) implantations formed using the first LDD mask.

2. The apparatus of claim 1, wherein the first SRAM portion comprises an array of SRAM bit cells, each comprising a first six transistor storage cell.

3. The apparatus of claim 1, wherein the second SRAM portion comprises an array of dual port SRAM bit cells, each comprising a first six transistor storage cell and a second two transistor read port.

4. The apparatus of claim 3, wherein the dual port SRAM further comprises the first six transistor storage cell wherein the transistors have LDD implants formed with the second LDD mask.

5. The apparatus of claim 1, wherein the dual port SRAM further comprises a read portion comprising two NMOS transistors and the two NMOS transistors have LDD implants formed with the first LDD mask.

6. The apparatus of claim 1 and further comprising a second core, which comprises:
a second logic portion having transistors with a third gate dielectric thickness and having LDD implants formed using a third LDD mask.

7. The apparatus of claim 6, wherein the second core further comprises a third SRAM array having transistors with the third gate dielectric thickness, and having at least one transistor with LDD implantations formed using the third LDD mask.

8. The apparatus of claim 7, wherein the third SRAM array is a dual port SRAM array.

9. The apparatus of claim 8, wherein the third SRAM array comprises eight transistor bit cells having six transistors forming a write portion, at least some of the six transistors having LDD implants formed with the second LDD mask.

10. An integrated circuit, comprising:
a core, comprising:
a first logic portion having a first gate dielectric thickness and NMOS transistors having LDD regions formed using a first LDD implant mask;
an embedded single port SRAM portion having the first gate dielectric thickness and NMOS transistors having LDD regions formed using a second LDD implant mask, the second LDD implant mask different from the first LDD implant mask; and
an embedded dual port SRAM portion having the first gate dielectric thickness and at least one NMOS transistor having LDD regions formed using the first LDD implant mask.

11. The integrated circuit of claim 10, wherein the dual port SRAM portion further comprises NMOS transistors in a write portion having the first gate dielectric thickness and formed using the second LDD implant mask.

12. The integrated circuit of claim 11 and further comprising:
    a second core, comprising:
        a second logic portion having a second gate dielectric thickness and NMOS transistors having LDD regions formed using a third LDD implant mask; and
        an embedded dual port SRAM portion having the second gate dielectric thickness and at least one NMOS transistor having LDD regions formed using the third LDD implant mask.

13. The integrated circuit of claim 11 and further comprising:
    a second core, comprising:
        a second logic portion having a second gate dielectric thickness and NMOS transistors having LDD regions formed using a third LDD implant mask; and
        a second embedded dual port SRAM portion having the second gate dielectric thickness and at least one NMOS transistor having LDD regions formed using the second LDD implant mask.

14. The integrated circuit of claim 11 and further comprising:
    a second core, comprising:
        a second logic portion having a second gate dielectric thickness and NMOS transistors having LDD regions formed using a third LDD implant mask; and
        a second embedded dual port SRAM portion having the second gate dielectric thickness and at least one NMOS transistor having LDD regions formed using the first LDD implant mask.

15. The integrated circuit of claim 12, wherein the embedded dual port SRAM portion having the second gate dielectric thickness further comprises another NMOS transistor having LDD regions formed using a fourth LDD implant mask.

16. An apparatus, comprising:
    a semiconductor substrate;
    an I/O portion comprising transistors having a first gate dielectric thickness;
    a core, comprising:
        a logic portion having transistors with a second gate dielectric thickness and having lightly doped drain (LDD) implantations formed using a first LDD mask;
        a first SRAM portion having transistors with the second gate dielectric thickness and having lightly doped drain (LDD) implantations formed using a second LDD mask different from the first LDD mask;
        a second SRAM portion having transistors with the second gate dielectric thickness and having at least one transistor with lightly doped drain (LDD) implantations formed using the first LDD mask; and
        a second core comprising a third logic portion having transistors with a third gate dielectric thickness and having LDD implants formed using a third LDD mask different from the first and the second LDD masks.

17. The apparatus of claim 16, the second core further comprising a third SRAM portion having transistors with the third gate dielectric thickness, and having at least one transistor with LDD implantations formed using the third LDD mask.

18. The apparatus of claim 17, wherein the second SRAM portion and the third SRAM portion each comprise an array of dual port SRAM bit cells, each of the dual port SRAM bit cells further comprising a first six transistor storage cell and a second two transistor read port.

19. The apparatus of claim 17, wherein the second SRAM portion comprises an array of dual port SRAM bit cells, each comprising a first six transistor storage cell and a second two transistor read port, and the third SRAM portion comprises an array of single port SRAM cells.

20. The apparatus of claim 17, wherein the third SRAM array is a dual port SRAM array.

* * * * *